(12) United States Patent
Guo et al.

(10) Patent No.: US 11,101,230 B2
(45) Date of Patent: Aug. 24, 2021

(54) ARRAY SUBSTRATE AND CHIP BONDING METHOD

(71) Applicant: Wuhan China Star Optoelectronics Technology Co., Ltd., Wuhan (CN)

(72) Inventors: Chunpeng Guo, Wuhan (CN); Yingchi Wang, Wuhan (CN); Chunhung Huang, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 441 days.

(21) Appl. No.: 16/308,484

(22) PCT Filed: Sep. 27, 2018

(86) PCT No.: PCT/CN2018/107974
§ 371 (c)(1),
(2) Date: Dec. 10, 2018

(87) PCT Pub. No.: WO2019/205487
PCT Pub. Date: Oct. 31, 2019

(65) Prior Publication Data
US 2021/0091027 A1 Mar. 25, 2021

(30) Foreign Application Priority Data
Apr. 27, 2018 (CN) .......................... 201810390115.4

(51) Int. Cl.
*H01L 23/00* (2006.01)
*H01L 27/12* (2006.01)
(Continued)

(52) U.S. Cl.
CPC .............. *H01L 24/06* (2013.01); *H01L 24/83* (2013.01); *H01L 25/18* (2013.01); *H01L 25/50* (2013.01);
(Continued)

(58) Field of Classification Search
CPC ......... H01L 24/06; H01L 24/83; H01L 25/18; H01L 25/50; H01L 27/124; H01L 23/544;
(Continued)

(56) References Cited

U.S. PATENT DOCUMENTS

2004/0165138 A1* 8/2004 Hwang .................. H01L 24/17
349/152

FOREIGN PATENT DOCUMENTS

| CN | 1979269 A | 6/2007 |
| CN | 101271206 A | 9/2008 |

(Continued)

*Primary Examiner* — Kyoung Lee
(74) *Attorney, Agent, or Firm* — Leong C. Lei

(57) ABSTRACT

The invention provides an array substrate and chip bonding method, the array substrate comprising: an active area, and a bonding area located around the active area, wherein the bonding area is provided with an input terminal group, a first output terminal group and a second output terminal a group; the first output terminal group is located at a side of the input terminal group away from the active area, and the second output terminal group is located between the first output terminal group and the input terminal group; when bonding chips, the first output terminal group or the second output terminal group is selected to cooperate with the input terminal group for chip bonding according to the chip type. By simultaneously providing the first and second output terminal groups, the bonding of the second type chip increases the distance between the chip and the edge of the array substrate.

8 Claims, 8 Drawing Sheets

(51) Int. Cl.
*H01L 25/18* (2006.01)
*H01L 25/00* (2006.01)
*G02F 1/1345* (2006.01)
*H01L 23/544* (2006.01)

(52) U.S. Cl.
CPC ........ *H01L 27/124* (2013.01); *G02F 1/13458* (2013.01); *H01L 23/544* (2013.01); *H01L 2223/54426* (2013.01); *H01L 2224/06155* (2013.01); *H01L 2224/06177* (2013.01); *H01L 2224/8313* (2013.01); *H01L 2224/83851* (2013.01)

(58) Field of Classification Search
CPC . H01L 2223/54426; H01L 2224/06155; H01L 2224/06177; H01L 2224/8313; H01L 2224/83851; G02F 1/13458; G02F 1/133; H05K 1/18
See application file for complete search history.

(56) References Cited

FOREIGN PATENT DOCUMENTS

| | | | |
|---|---|---|---|
| CN | 201319098 | Y | 9/2009 |
| CN | 107422551 | A | 12/2017 |
| CN | 108375849 | A | 8/2018 |
| JP | H09244051 | A | 9/1997 |
| JP | 2008304495 | A | 12/2008 |
| JP | 2011175215 | A | 9/2011 |

* cited by examiner

ARRAY SUBSTRATE AND CHIP BONDING METHOD

BACKGROUND OF THE INVENTION

1. Field of the Invention

The present invention relates to the field of display, and in particular to an array substrate and chip bonding method.

2. The Related Arts

With the development of display technology, the panel display devices such as liquid crystal displays (LCDs), due to the advantages of high image quality, power saving, thinness and wide application range, are widely applied to various consumer electronic products, such as, mobile phones, televisions, personal digital assistants (PDA), digital cameras, notebook computers, and desktop computers, and have become mainstream in display devices.

Chip on glass mura (COG mura) is currently an important quality problem for LCD panels. The existing chip bonding process includes: attaching an anisotropic conductive film (ACF) to a surface of the array substrate, and then placing the chip on a predetermined bonding position on the array substrate, and finally using a thermal head to press the chip to electrically connect the chip pins to the bonding terminals on the array substrate through the conductive particles contained in the ACF, and simultaneously converting the ACF from a gel to a solid to bond the chip on the array substrate. The reason why the chip is poorly bonded is that when the ACF is cured at a high temperature, the high temperature causes the chip and the thin film transistor (TFT) to also expand, thereby causing the uneven portion of the cell gap near the chip, leading to contrast difference when displaying.

With the development of display technology, more and more types of products and more and more types of chips are provided. The design process of the array substrate often has to take into account the bonding of a variety of different chips. A typical chip is as shown a chip not integrated with random access memory (RAM) chip and a chip integrated with RAM. As shown in FIG. 1, the existing chip not integrated with RAM includes: a first input pin group 101, and a first output pin group 102 disposed spaced apart from the first input pin group 101, and two first alignment marks 103 located on both sides of the first input pin group 101. As shown in FIG. 2, the existing chip integrated with RAM includes: a second input pin group 201, a second output pin group 202 disposed spaced apart from the second input pin group 201, and two second alignment marks 203 on both sides of the second input pin group 201. The difference between the chips shown in FIG. 1 and FIG. 2 is that the distance between the first input pin group 101 and the first output pin group 102 is smaller than the distance between the second input pin group 201 and the second output pin groups 202. To make the array substrate able to accommodate the two types of chips, as shown in FIG. 3, the prior art provides an array substrate, including: an active area 300, and a bonding area 400 located around the active area 300, the bonding area 400 is disposed with an input terminal group 401 and an output terminal group 402, and the output terminal group 402 is located at a side of the input terminal group 401 away from the active area 300, wherein the length of each terminal in the input terminal group 401 in longer than the usual terminals. When performing chip bonding, as shown in FIG. 4, if the chip is a chip not integrated with RAM, the first output pin group 102 and the output terminal group 402 are bonded, the first input pin group 101 is bonded to the upper half of the input terminal group 401; as shown in FIG. 5, if the chip is a chip integrated with RAM, the second output pin group 202 and the output terminal group 402 are bonded, the second input pin group 201 is bonded to the lower half of the input terminal group 401, so that the array substrate can simultaneously accommodate the above two kinds of chips.

At present, it is known that the distance from the edge of the chip to the edge of the array substrate is one of the main factors affecting the poor bonding of the chip. In the array substrate shown in FIG. 3, the distance from the edge of the array substrate, after the two chips are bonded together, is the same. The chip not integrated with RAM, which is smaller in size and more widely applied, is also very close to the edge of the array substrate, resulting in a high probability of poor chip bonding.

SUMMARY OF THE INVENTION

The object of the present invention is to provide an array substrate, able to reduce poor chip bonding and ensure display quality.

Another object of the present invention is to provide a chip bonding method, able to reduce poor chip bonding and ensure display quality.

To achieve the above object, the present invention provides an array substrate, which comprises: an active area, a bonding area located around the active area, wherein the bonding area being provided with an input terminal group, a first output terminal group and a second output terminal group;

the first output terminal group being located at a side of the input terminal group away from the active area, and the second output terminal group being located between the first output terminal group and the input terminal group;

when bonding chips, the first output terminal group or the second output terminal group being selected to cooperate with the input terminal group for chip bonding according to the type of the chip.

Preferably, the bonding area is further provided with a first alignment mark corresponding to the first output terminal group and a second alignment mark corresponding to the second output terminal group.

Preferably, the bonding area is further provided with a first output lead wire connecting the first output terminal group and the active area, and a second output lead wire connecting the second output terminal group and the active area.

Preferably, there are two types of chips, respectively a first type chip and a second type chip, the first type chip is larger in size than the second type chip; the first type chip is bonded through the first output terminal group and the input terminal group, and the second type chip is bonded through the second output terminal group and the input terminal group.

Preferably, the first type chip is a chip integrated with RAM, and the second type chip is a chip not integrated with RAM.

The present invention also provides a chip bonding method, which comprises the steps of:

Step S1: providing an array substrate, the array substrate comprising: an active area, a bonding area located around the active area, wherein the bonding area being provided with an input terminal group, a first output terminal group and a second output terminal group;

the first output terminal group being located at a side of the input terminal group away from the active area, and the second output terminal group being located between the first output terminal group and the input terminal group;

Step S2: providing a chip, determining a type of the chip, and selecting the first output terminal group or the second output terminal group to cooperate with the input terminal group to perform chip bonding according to the type of the chip.

Preferably, the bonding area is further provided with a first alignment mark corresponding to the first output terminal group and a second alignment mark corresponding to the second output terminal group, a first output lead wire connecting the first output terminal group and the active area, and a second output lead wire connecting the second output terminal group and the active area.

Preferably, before performing chip bonding in the step S2, the chip is aligned with the first output terminal group by the first pair of alignment marks or aligned with the second output terminal group by the second pair of alignment marks.

Preferably, there are two types of chips, respectively a first type chip and a second type chip, the first type chip is larger in size than the second type chip;

in step S2, when the chip is a first type chip, the chip bonding is performed through the first output terminal group and the input terminal group, and when the chip is a second type chip, the chip bonding is performed through the second output terminal group and the input terminal group.

Preferably, the first type chip is a chip integrated with RAM, and the second type chip is a chip not integrated with RAM.

The present invention provides the following advantages: the present invention provides an array substrate, the array substrate comprising: an active area, and a bonding area located around the active area, wherein the bonding area is provided with an input terminal group, a first output terminal group and a second output terminal a group; the first output terminal group is located at a side of the input terminal group away from the active area, and the second output terminal group is located between the first output terminal group and the input terminal group; when bonding chips, the first output terminal group or the second output terminal group being selected to cooperate with the input terminal group for chip bonding according to the type of the chip. As such, the distance between the chip on the second output terminal group and the edge of the array substrate is reduced when bonding the chip, the probability of poor chip bonding is also reduced and display quality is ensured. The present invention also provides a chip bonding method, capable of reducing poor chip bonding and ensuring display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 6:
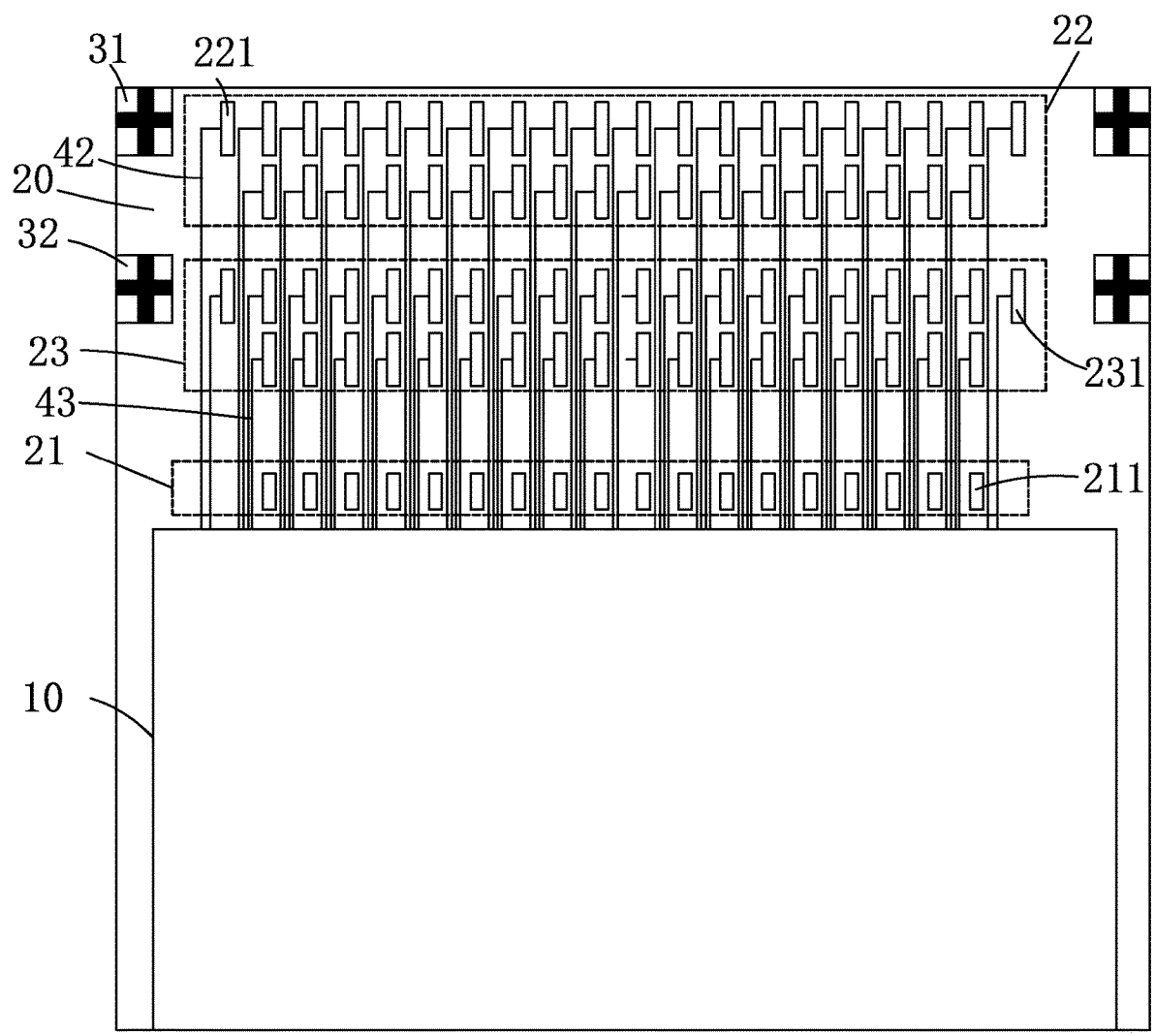
FIG. 6 is a schematic view showing the array substrate of the present invention.

Refer to FIG. 6. The present invention provides an array substrate, comprising: an active area 10, a bonding area 20 located around the active area 10, wherein the bonding area 20 being provided with an input terminal group 21, a first output terminal group 22 and a second output terminal group 23;

the first output terminal group 22 being located at a side of the input terminal group 21 away from the active area 10, and the second output terminal group 23 being located between the first output terminal group 22 and the input terminal group 21; in other words, the first output terminal group 22, the second output terminal group 23 and the input terminal group 21 are sequentially disposed from top to bottom, and the distance to the edge of the array substrate is also gradually increasing.

When bonding chips, the first output terminal group 22 or the second output terminal group 23 is selected to cooperate with the input terminal group 21 for chip bonding according to the type of the chip.

Specifically, as shown in FIG. 6, in a preferred embodiment of the present invention, the input terminal group 21 comprises a plurality of input terminals 211 arranged in a row from left to right, the first output terminal group 22 comprises a plurality of first output terminals 221 arranged in two rows from left to right, and the second output terminal group 23 comprises a plurality of second output terminals 231 arranged in two rows from left to right. The plurality of first output terminals 221 and the plurality of second output terminals 231 are arranged in the same manner.

Specifically, to enable the chip to be able to communicate with the active area 10 after bonding, the bonding area 20 is further provided with a first output lead wire 42 connecting the first output terminal group 22 and the active area 10, and a second output lead wire 43 connecting the second output terminal group 23 and the active area 10. Furthermore, the number of the first output lead wires 42 is equal to the number of the first output terminals 221, with each first output terminal 221 electrically connected to the active area 10 through a first output lead wire 42. The number of the second output lead wires 43 is equal to the number of the second output terminals 231, with each of the second output terminals 231 is electrically connected to the active area 10 electrically connected through a second output lead 43.

It should be noted that the input terminals 211, the first output terminals 221, and the second output terminals 231 are formed on the same metal layer, and the first output lead wire 42 and the second output lead wire 43 are formed on another metal layer below the metal layer of the input terminal 211, the first output terminal 221, and the second output terminal 231. The first output lead wire 42 and the second output lead wire 43 are electrically connected to the first output terminal 221 and the second output terminal 231 through via holes, respectively.

Specifically, the bonding area 20 is further provided with a pair of first alignment marks 31 corresponding to the first output terminal group 22 and a pair of second alignment marks 32 corresponding to the second output terminal group 23. Furthermore, the shape of the alignment marks is a cross, the two first alignment marks 31 are respectively located on the left and right sides of the first output terminal group 22, and the two second alignment marks 32 are respectively located on the left and right sides of the second output terminal group 23.

Specifically, in a preferred embodiment of the present invention, there are two types of chips, respectively a first type chip and a second type chip, the first type chip is larger in size than the second type chip; the first type chip is bonded through the first output terminal group 22 and the input terminal group 21, and the second type chip is bonded through the second output terminal group 23 and the input terminal group 21.

Figure 1:
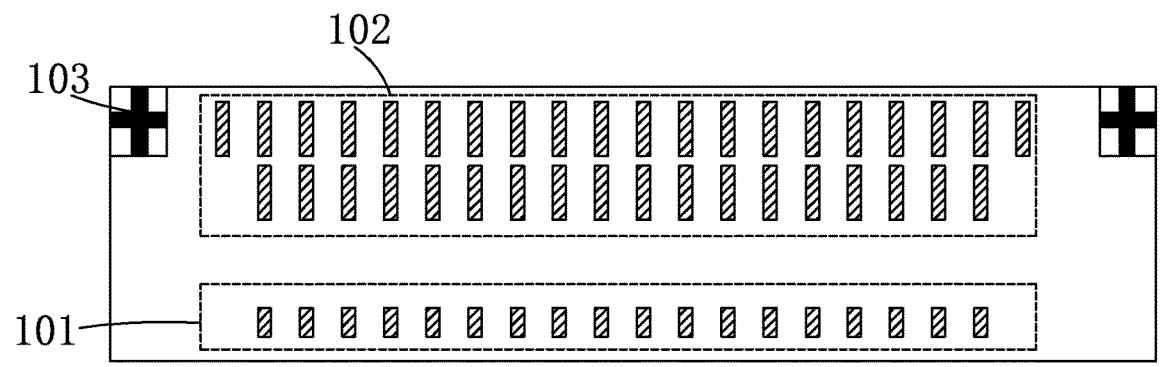
FIG. 1 is a schematic view showing the structure of a chip not integrated with random access memory.
Figure 2:
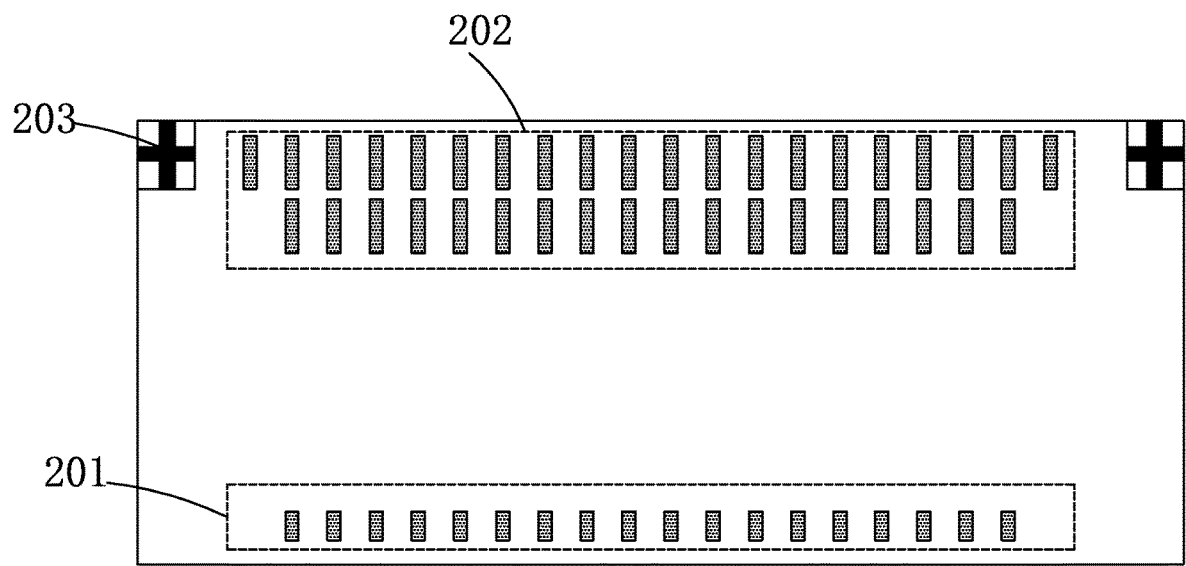
FIG. 2 is a schematic view showing the structure of a chip integrated with random access memory.
Figure 3:
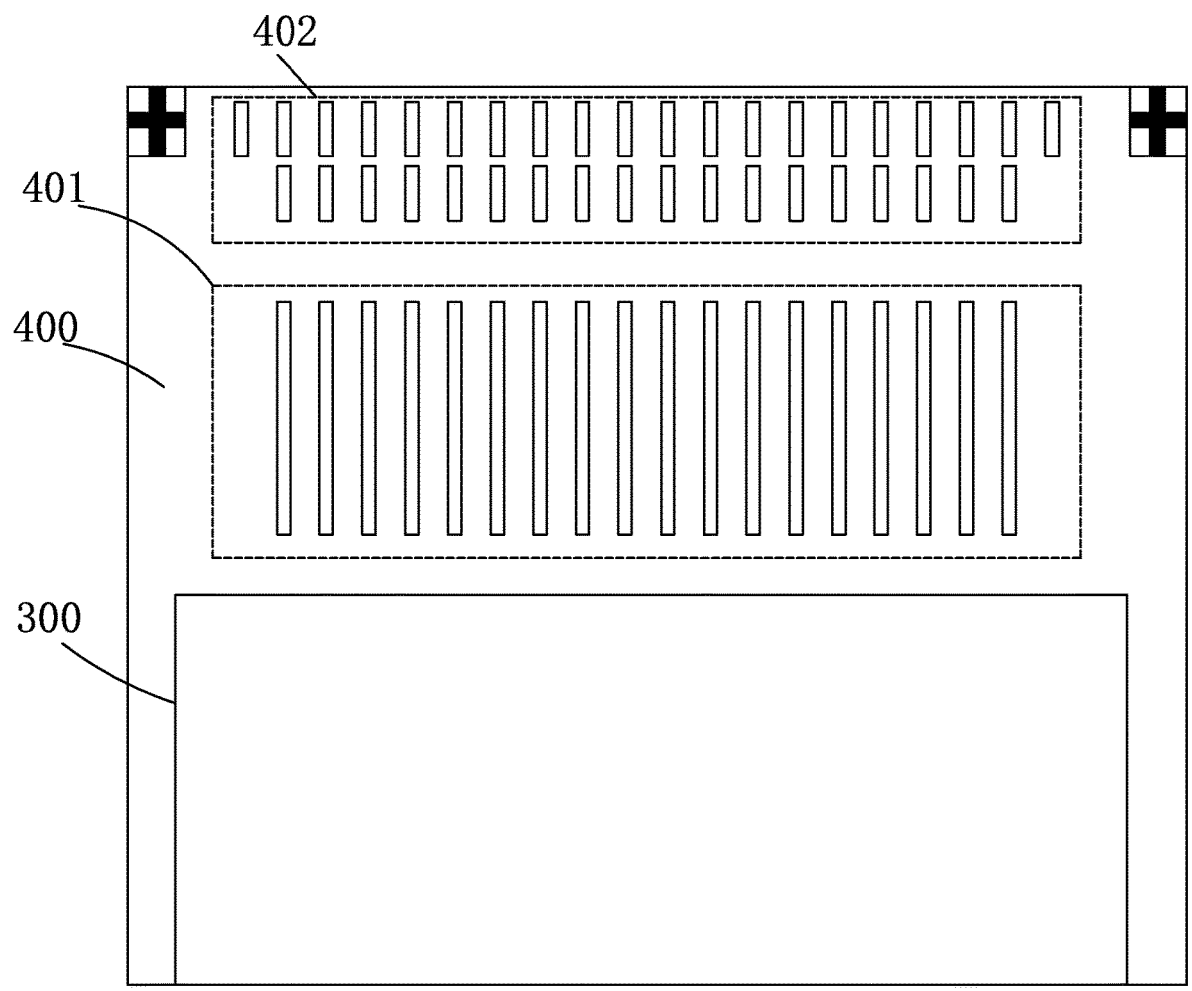
FIG. 3 is a schematic view showing a known array substrate.
Figure 4:
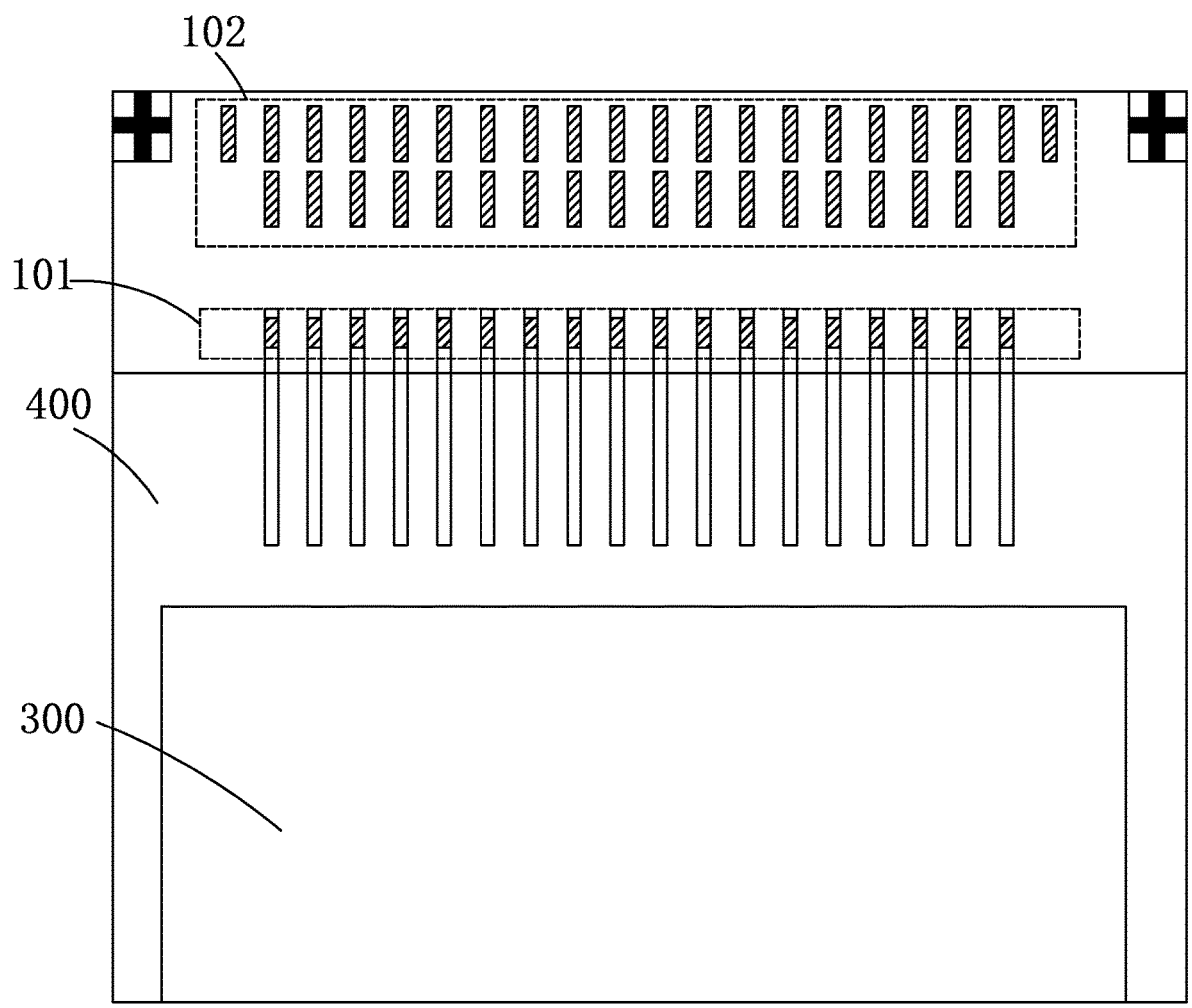
FIG. 4 is a schematic view showing the bonding of a chip not integrated with random access memory on the known array substrate.
Figure 5:
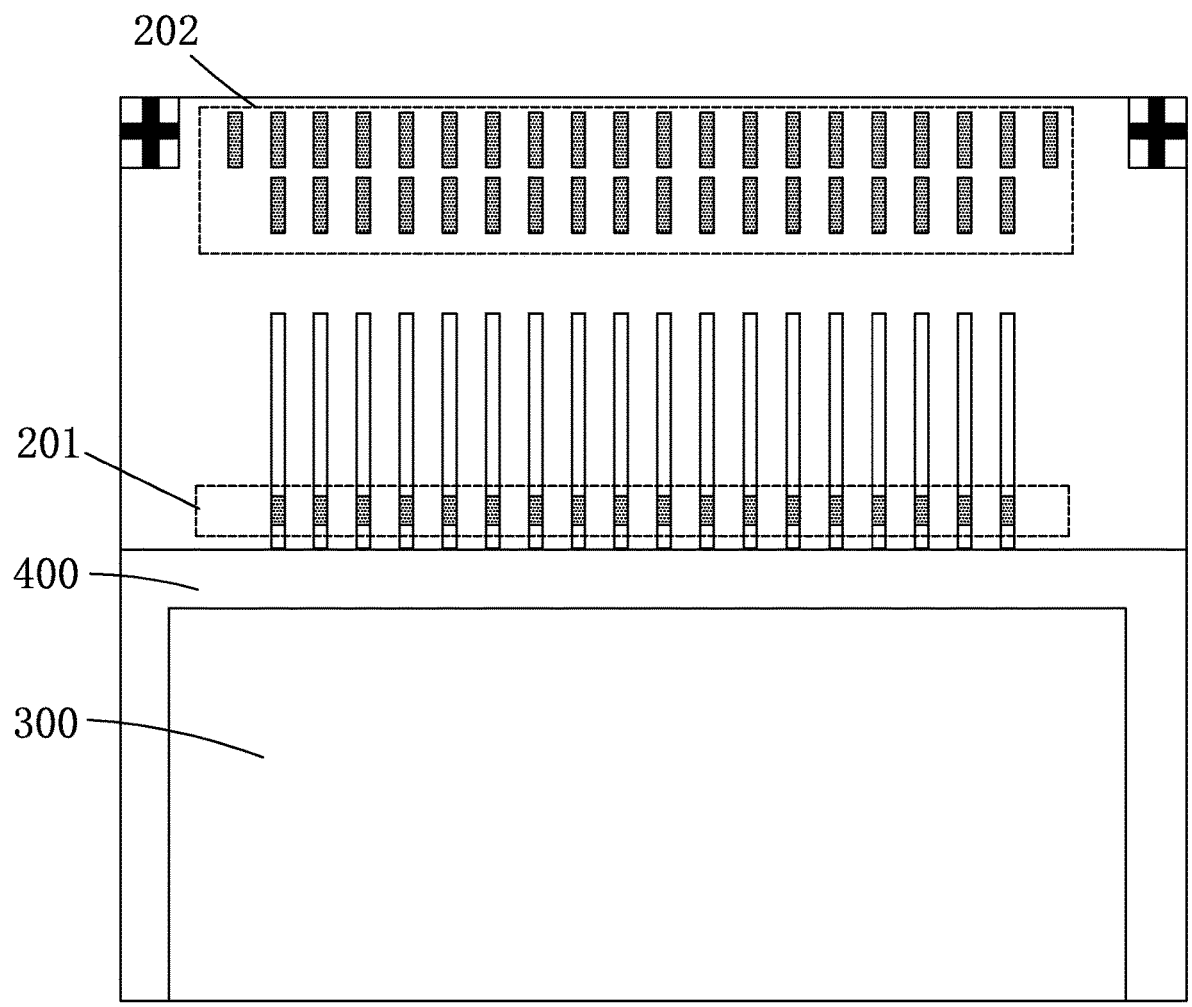
FIG. 5 is a schematic view showing the bonding of a chip integrated with random access memory on the known array substrate.

Moreover, the first type chip is a chip integrated with RAM as shown in FIG. 2, and the second type chip is a chip not integrated with RAM shown in FIG. 1.

Figure 7:
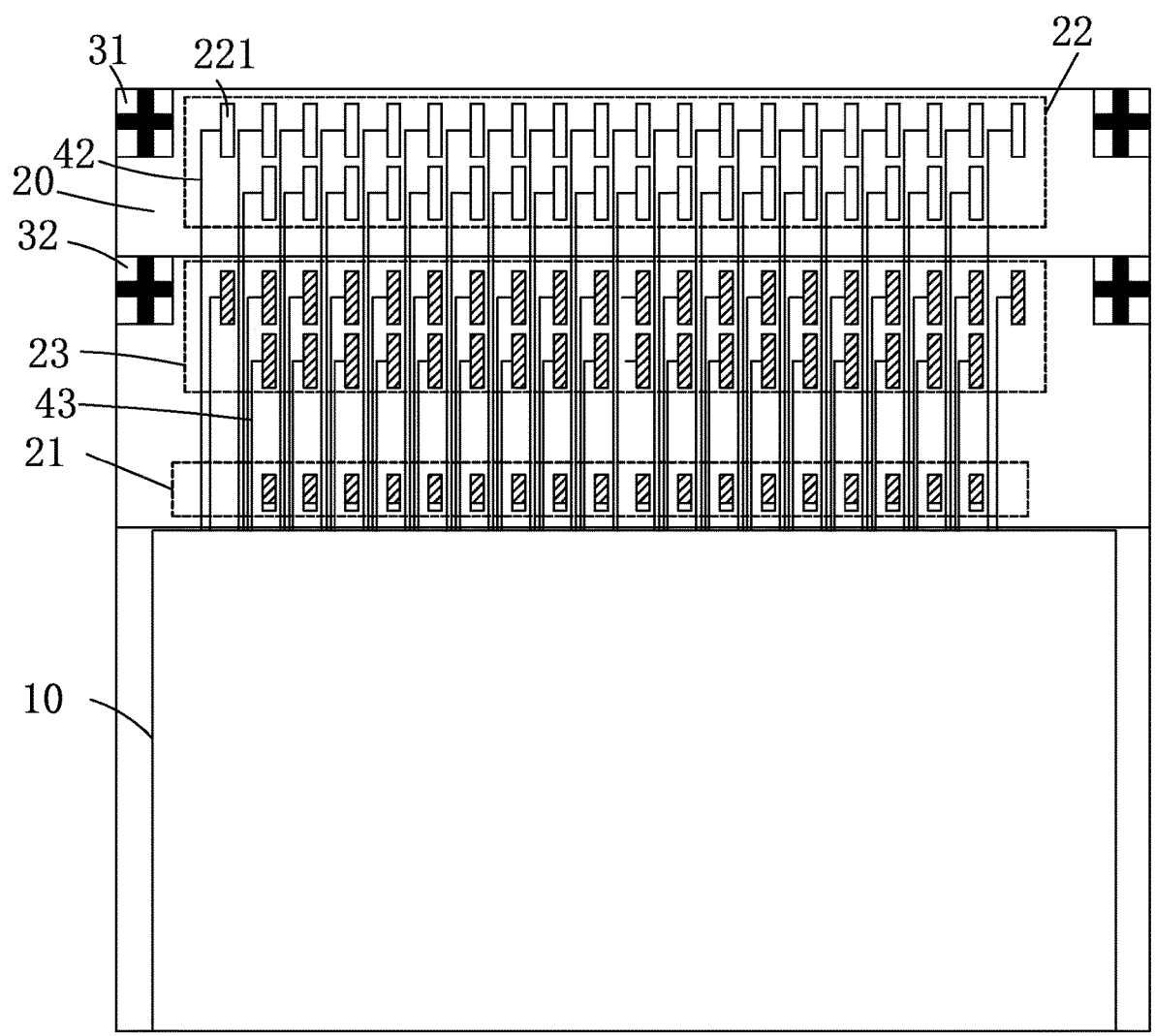
FIG. 7 is a schematic view showing the bonding of a chip not integrated with random access memory on the array substrate of the present invention.
Figure 8:
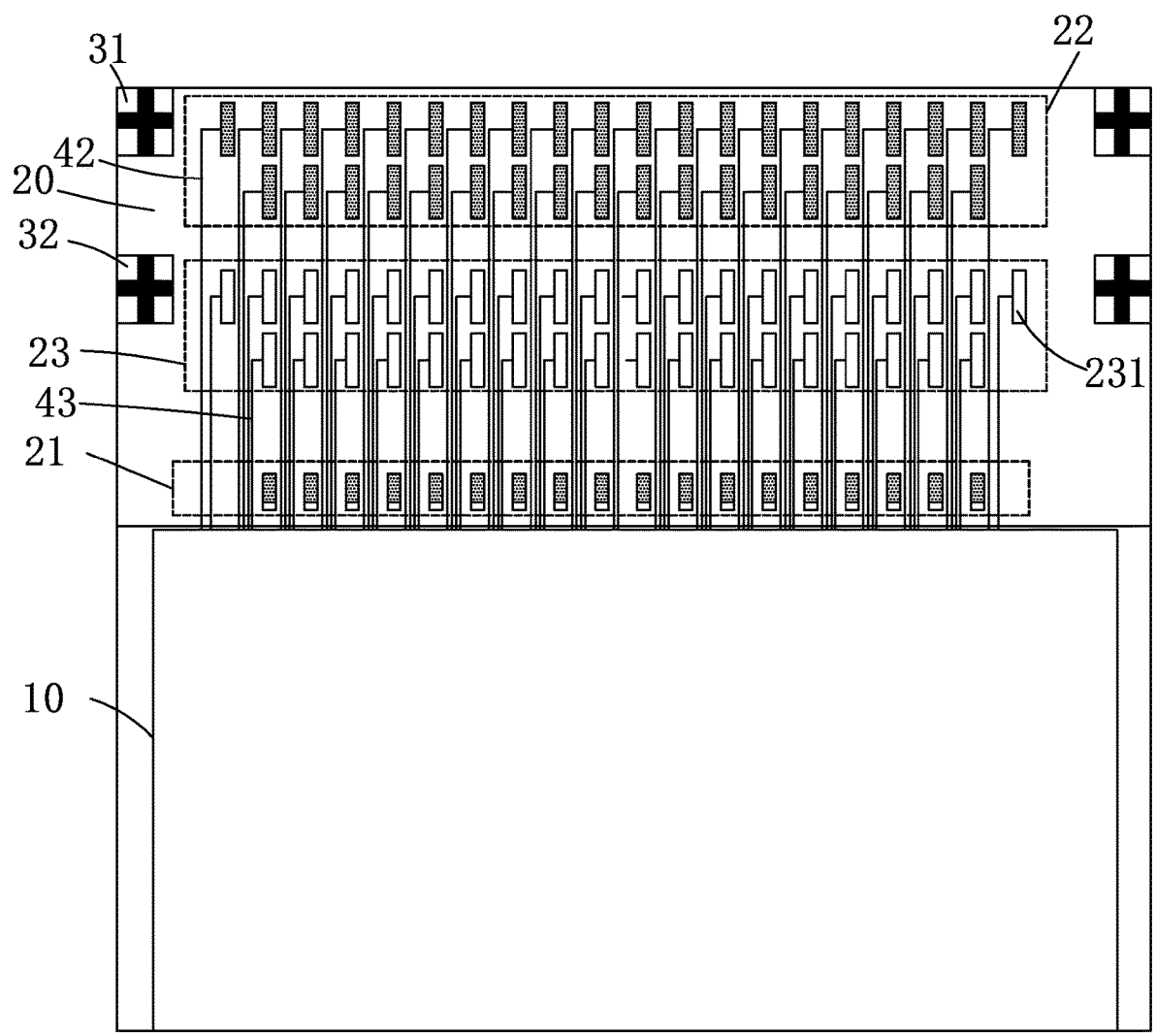
FIG. 8 is a schematic view showing the bonding of a chip integrated with random access memory on the array substrate of the present invention.

Specifically, the bonding process comprises: first identifying whether the chip is a first type chip or a second type chip; referring to FIG. 7, when the chip is a first type chip, attaching an ACF glue to the area of the array substrate corresponding to the input terminal group 21 and the first output terminal group 22, and then aligning with the chip through the first alignment marks 31 so that the output pins of the chip are aligned with the first output terminal group 22, and the input pins are aligned with the input terminal group 21. Finally, the chip is pressed by a thermal head, and the chip pins are electrically connected to the bonding terminal on the array substrate through the conductive particles contained in the ACF, and the ACF is simultaneously converted from a gel to a solid state to fix the chip on the array substrate to realize chip bonding. Referring to FIG. 8, when the chip is a second type chip, attaching an ACF glue to the area of the array substrate corresponding to the input terminal group 21 and the second output terminal group 23, and then aligning with the chip through the second alignment marks 32 so that the output pins of the chip are aligned with the second output terminal group 23, and the input pins are aligned with the input terminal group 21. Finally, the chip is pressed by a thermal head, and the chip pins are electrically connected to the bonding terminal on the array substrate through the conductive particles contained in the ACF, and the ACF is simultaneously converted from a gel to a solid state to fix the chip on the array substrate to realize chip bonding.

It should be noted that, by simultaneously providing the first output terminal group and the second output terminal group, the bonding of the second type chip, that is, the chip not integrated with RAM, can increase the distance between the chip bonded to the second output terminal group on the array substrate and the edge of the array substrate to reduce the chance of poor chip bonding.

Figure 9:
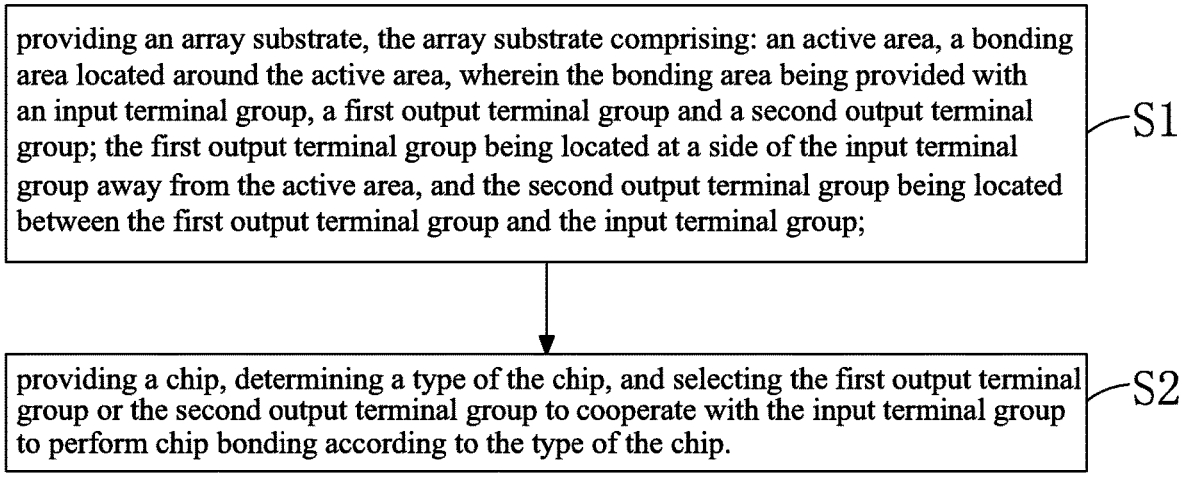
FIG. 9 is a schematic view showing the flowchart of the chip bonding method of the present invention.

Refer to FIG. 9. The present invention also provides a chip bonding method, comprising the steps of:

Step S1: providing an array substrate, the array substrate comprising: an active area 10, a bonding area 20 located around the active area 10, wherein the bonding area 20 being provided with an input terminal group 21, a first output terminal group 22 and a second output terminal group 23;

the first output terminal group 22 being located at a side of the input terminal group 21 away from the active area 10, and the second output terminal group 23 being located between the first output terminal group 22 and the input terminal group 21; in other words, the first output terminal group 22, the second output terminal group 23 and the input terminal group 21 are sequentially disposed from top to bottom, and the distance to the edge of the array substrate is also gradually increasing.

Specifically, as shown in FIG. 6, in a preferred embodiment of the present invention, the input terminal group 21 comprises a plurality of input terminals 211 arranged in a row from left to right, the first output terminal group 22 comprises a plurality of first output terminals 221 arranged in two rows from left to right, and the second output terminal group 23 comprises a plurality of second output terminals 231 arranged in two rows from left to right. The plurality of first output terminals 221 and the plurality of second output terminals 231 are arranged in the same manner.

Specifically, to enable the chip to be able to communicate with the active area 10 after bonding, the bonding area 20 is further provided with a first output lead wire 42 connecting the first output terminal group 22 and the active area 10, and a second output lead wire 43 connecting the second output terminal group 23 and the active area 10. Furthermore, the number of the first output lead wires 42 is equal to the number of the first output terminals 221, with each first output terminal 221 electrically connected to the active area 10 through a first output lead wire 42. The number of the second output lead wires 43 is equal to the number of the second output terminals 231, with each of the second output terminals 231 is electrically connected to the active area 10 electrically connected through a second output lead 43.

It should be noted that the input terminal 211, the first output terminal 221, and the second output terminal 231 are formed on the same metal layer, and the first output lead 42 and the second output lead 43 are formed on the input terminal 211, the first output terminal 221, and the second The other metal layer below the metal layer where the output terminal 231 is located, the first output lead 42 and the second output lead 43 are electrically connected to the first output terminal 221 and the second output terminal 231 through via holes, respectively.

Specifically, the bonding area 20 is further provided with a pair of first alignment marks 31 corresponding to the first output terminal group 22 and a pair of second alignment marks 32 corresponding to the second output terminal group 23. Furthermore, the shape of the alignment marks is a cross, the two first alignment marks 31 are respectively located on the left and right sides of the first output terminal group 22, and the two second alignment marks 32 are respectively located on the left and right sides of the second output terminal group 23.

Specifically, in a preferred embodiment of the present invention, there are two types of chips, respectively a first type chip and a second type chip, the first type chip is larger in size than the second type chip; the first type chip is bonded through the first output terminal group 22 and the input terminal group 21, and the second type chip is bonded through the second output terminal group 23 and the input terminal group 21.

Moreover, the first type chip is a chip integrated with RAM as shown in FIG. 2, and the second type chip is a chip not integrated with RAM shown in FIG. 1.

Step S2: providing a chip, determining a type of the chip, and selecting the first output terminal group 22 or the second output terminal group 23 to cooperate with the input terminal group 21 to perform chip bonding according to the type of the chip.

Specifically, the bonding process comprises: first identifying whether the chip is a first type chip or a second type chip; referring to FIG. 7, when the chip is a first type chip, attaching an ACF glue to the area of the array substrate corresponding to the input terminal group 21 and the first output terminal group 22, and then aligning with the chip through the first alignment marks 31 so that the output pins of the chip are aligned with the first output terminal group 22, and the input pins are aligned with the input terminal group 21. Finally, the chip is pressed by a thermal head, and the chip pins are electrically connected to the bonding terminal on the array substrate through the conductive particles contained in the ACF, and the ACF is simultaneously converted from a gel to a solid state to fix the chip on the array substrate to realize chip bonding. Referring to FIG. 8, when the chip is a second type chip, attaching an ACF glue to the area of the array substrate corresponding to the input terminal group 21 and the second output terminal group 23, and then aligning with the chip through the second alignment marks 32 so that the output pins of the chip are aligned with the second output terminal group 23, and the input pins are aligned with the input terminal group 21. Finally, the chip is pressed by a thermal head, and the chip pins are electrically connected to the bonding terminal on the array substrate through the conductive particles contained in the ACF, and the ACF is simultaneously converted from a gel to a solid state to fix the chip on the array substrate to realize chip bonding.

It should be noted that, by simultaneously providing the first output terminal group and the second output terminal group, the bonding of the second type chip, that is, the chip not integrated with RAM, can increase the distance between the chip bonded to the second output terminal group on the array substrate and the edge of the array substrate to reduce the chance of poor chip bonding.

In summary, the present invention provides an array substrate, the array substrate comprising: an active area, and a bonding area located around the active area, wherein the bonding area is provided with an input terminal group, a first output terminal group and a second output terminal a group; the first output terminal group is located at a side of the input terminal group away from the active area, and the second output terminal group is located between the first output terminal group and the input terminal group; when bonding chips, the first output terminal group or the second output terminal group being selected to cooperate with the input terminal group for chip bonding according to the type of the chip. As such, the distance between the chip on the second output terminal group and the edge of the array substrate is reduced when bonding the chip, the probability of poor chip bonding is also reduced and display quality is ensured. The present invention also provides a chip bonding method, capable of reducing poor chip bonding and ensuring display quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising: an active area, a bonding area located around the active area, wherein the bonding area being provided with an input terminal group, a first output terminal group and a second output terminal group;
   the first output terminal group being located at a side of the input terminal group away from the active area, and the second output terminal group being located between the first output terminal group and the input terminal group;
   when bonding chips, the first output terminal group or the second output terminal group being selected to cooperate with the input terminal group for chip bonding according to the type of the chip;
   wherein the bonding area is further provided with a first alignment mark corresponding to the first output terminal group and a second alignment mark corresponding to the second output terminal group.

2. The array substrate as claimed in claim 1, wherein the bonding area is further provided with a first output lead wire connecting the first output terminal group and the active area, and a second output lead wire connecting the second output terminal group and the active area.

3. The array substrate as claimed in claim 1, wherein there are two types of chips, respectively a first type chip and a second type chip, the first type chip is larger in size than the second type chip; the first type chip is bonded through the first output terminal group and the input terminal group, and the second type chip is bonded through the second output terminal group and the input terminal group.

4. The array substrate as claimed in claim 3, wherein the first type chip is a chip integrated with random access memory (RAM), and the second type chip is a chip not integrated with RAM.

5. A chip bonding method, comprising the steps of:
   Step S1: providing an array substrate, the array substrate comprising: an active area, a bonding area located around the active area, wherein the bonding area being provided with an input terminal group, a first output terminal group and a second output terminal group;
   the first output terminal group being located at a side of the input terminal group away from the active area, and the second output terminal group being located between the first output terminal group and the input terminal group;
   Step S2: providing a chip, determining a type of the chip, and selecting the first output terminal group or the second output terminal group to cooperate with the input terminal group to perform chip bonding according to the type of the chip;

wherein the bonding area is further provided with a first alignment mark corresponding to the first output terminal group and a second alignment mark corresponding to the second output terminal group, a first output lead wire connecting the first output terminal group and the active area, and a second output lead wire connecting the second output terminal group and the active area.

6. The chip bonding method as claimed in claim 5, wherein before performing chip bonding in the step S2, the chip is aligned with the first output terminal group by the first pair of alignment marks or aligned with the second output terminal group by the second pair of alignment marks.

7. The chip bonding method as claimed in claim 5, wherein there are two types of chips, respectively a first type chip and a second type chip, the first type chip is larger in size than the second type chip;
   in step S2, when the chip is a first type chip, the chip bonding is performed through the first output terminal group and the input terminal group, and when the chip is a second type chip, the chip bonding is performed through the second output terminal group and the input terminal group.

8. The chip bonding method as claimed in claim 7, wherein the first type chip is a chip integrated with random access memory (RAM), and the second type chip is a chip not integrated with RAM.

* * * * *